United States Patent
Ikeda

(10) Patent No.: US 11,913,985 B2
(45) Date of Patent: Feb. 27, 2024

(54) LIGHT SOURCE DEVICE INCLUDING DISCHARGE LAMP, IRRADIATION DEVICE AND DISTINGUISHING METHOD FOR DISCHARGE LAMP

(71) Applicant: PHOENIX ELECTRIC CO., LTD., Hyogo (JP)

(72) Inventor: Tomihiko Ikeda, Hyogo (JP)

(73) Assignee: PHOENIX ELECTRIC CO., LTD, Hyogo (JP)

( * ) Notice: Subject to any disclaimer, the term of this patent is extended or adjusted under 35 U.S.C. 154(b) by 839 days.

(21) Appl. No.: 16/978,331

(22) PCT Filed: Mar. 1, 2019

(86) PCT No.: PCT/JP2019/008241
§ 371 (c)(1),
(2) Date: Sep. 4, 2020

(87) PCT Pub. No.: WO2019/176600
PCT Pub. Date: Sep. 19, 2019

(65) Prior Publication Data
US 2021/0003627 A1    Jan. 7, 2021

(30) Foreign Application Priority Data
Mar. 13, 2018  (JP) ................................. 2018-046077

(51) Int. Cl.
*G01R 31/24*      (2020.01)
*G03F 7/20*       (2006.01)
(52) U.S. Cl.
CPC ......... *G01R 31/245* (2013.01); *G03F 7/2004* (2013.01); *G03F 7/2008* (2013.01)

(58) Field of Classification Search
CPC ... G03F 7/2004; G03F 7/2008; G01R 31/245; H01J 61/548; H01J 61/822; H05K 3/027; H05B 35/00; H05B 45/00; H05B 41/04
(Continued)

(56) References Cited

U.S. PATENT DOCUMENTS

2009/0134813 A1\* 5/2009 Kitamura ............. H05B 41/295
                                                    315/291
2009/0224667 A1   9/2009 Fujii et al.

FOREIGN PATENT DOCUMENTS

CA    2761526 A1 \* 11/2010 ............. H01J 61/54
CN   101192501 A    6/2008
(Continued)

OTHER PUBLICATIONS

Office Action dated Feb. 11, 2023 for the corresponding Chinese patent application No. 201980016097.6, with English translation (12 pages).
(Continued)

*Primary Examiner* — Lee E Rodak
*Assistant Examiner* — Trung Q Nguyen
(74) *Attorney, Agent, or Firm* — LUCAS & MERCANTI, LLP

(57) ABSTRACT

It is intended to provide an irradiation device that can achieve good starting performance even without encapsulating a starting performance promoting substance into the internal space of a luminous tube in a discharge lamp, and simultaneously, can distinguish whether the discharge lamp is a genuine product or not. An irradiation device (50) is composed of a discharge lamp (110) provided as a light source and an ultraviolet light source (200) irradiating ultraviolet light to the discharge lamp (110) to detect whether the discharge lamp (110) is a genuine product or not in activation of the discharge lamp (110).

7 Claims, 8 Drawing Sheets

(58) Field of Classification Search
USPC .................. 324/403–414, 500, 600, 76.11
See application file for complete search history.

(56) References Cited

FOREIGN PATENT DOCUMENTS

| | | |
|---|---|---|
| CN | 106061077 A | 10/2016 |
| JP | 3137961 U | 12/2007 |
| JP | 2009-181927 A | 8/2009 |
| JP | 2009-212041 A | 9/2009 |
| JP | 4995342 B1 | 8/2012 |
| JP | 2013-109144 A | 6/2013 |
| JP | 2016-200751 A | 12/2016 |
| TW | 201708971 A | 3/2017 |

OTHER PUBLICATIONS

PCT, International Search Report for the corresponding patent application No. PCT/JP2019/008241, dated Apr. 9, 2019, with English translation.

Office Action dated Nov. 15, 2022 for the corresponding Japanese patent application No. 2020-506403, with English translation.

Office Action dated Nov. 24, 2022 for the corresponding Taiwanese patent application No. 108107961, with English translation.

* cited by examiner

LIGHT SOURCE DEVICE INCLUDING DISCHARGE LAMP, IRRADIATION DEVICE AND DISTINGUISHING METHOD FOR DISCHARGE LAMP

CROSS REFERENCE TO RELATED APPLICATION

This Application is a 371 of PCT/JP2019/008241 filed on Mar. 1, 2019 which, in turn, claimed the priority of Japanese Patent Application No. 2018-046077 filed on Mar. 13, 2018, both applications are incorporated herein by reference.

TECHNICAL FIELD

The present invention relates to, for instance, a light source device including a discharge lamp emitting light used for exposure of a printed wiring board or so forth, an irradiation device, and a method of distinguishing whether the discharge lamp is a genuine product or not.

BACKGROUND OF THE INVENTION

A type of printed wiring board has a structure that a wiring pattern, made of metal such as copper, is formed on a substrate made of resin or glass epoxy material, and has been conventionally used for mounting components to an electronic device. The technique of photoetching has been used for forming the wiring pattern on the printed wiring board. Photoetching is executed by preparing a substrate that a metal layer is disposed as a prospective wiring on the entire surface thereof; applying a light-sensitive chemical agent as a photoresist to the entire surface of the substrate; and irradiating the photoresist with light from an exposure device through a photomask having the same shape as the wiring pattern.

There are following types of photoresist: one is a negative photoresist that is reduced in solubility by light irradiated thereto, and the other is a positive photoresist that is, contrarily to the negative photoresist, increased in solubility by light irradiated thereto. Part of the photoresist is relatively increased in solubility by light irradiated thereto and is removed by chemical processing. Part of the metal layer is thus exposed and is then removed by etching. Accordingly, only part of the metal layer, disposed under the remaining part of the photoresist, is left unetched. Finally, the remaining part of the photoresist is removed. In this way, a wiring pattern is formed on the substrate. In irradiating a photoresist with light, regardless of whether the photoresist is of a positive type or a negative type, discharge lamps each having a large emission amount are used as a light source in order to reliably expose the entirety of the irradiated surface of the photoresist with a homogeneous exposed amount.

In the discharge lamp, a pair of electrodes is disposed in opposition to and away from each other in the airtight, internal space of a luminous tube. The discharge lamp is configured to generate an arc discharge between the pair of electrodes, whereby mercury encapsulated in the internal space is excited and emits ultraviolet light.

In order to start lighting the discharge lamp, the following procedure is performed: a glow discharge is started between the pair of electrodes, and afterwards, the glow discharge is transitioned to an arc discharge. However, in starting the glow discharge, it is required to cause dielectric breakdown between the pair of electrodes physically separated from each other under vacuum environment. In causing the dielectric breakdown, it is required to apply a large voltage at a high frequency to the pair of electrodes. However, a power supply device for applying such a large voltage is quite expensive, and the following is also pointed out: the high frequency generated by the power supply device has possibility of inducing malfunctions of surrounding machines. Because of this, a variety of ingenious techniques have been proposed to start a discharge at as lower voltage and frequency as possible, i.e., to enhance starting performance of the discharge lamp.

For example, Patent Document 1 describes a technique for enhancing the starting performance by encapsulating a starting performance promoting substance (e.g., krypton-85) into the internal space of the luminous tube.

CITATION LIST

Patent Document 1: Japan Laid-open Patent Application Publication No. 2009-181927

SUMMARY OF THE INVENTION

Technical Problems

A discharge lamp shows better starting performance when krypton-85 is encapsulated in the internal space of the luminous tube thereof. However, adverse effects on environment are concerned in disposal of such a discharge lamp.

Besides, if a type of irradiation device is developed with an ingenious technique to enhance the starting performance of a discharge lamp without encapsulation of krypton-85, chances are that a non-genuine discharge lamp with encapsulation of krypton-85 is mixed with genuine discharge lamps without encapsulation of krypton-85 and is attached together with the genuine discharge lamps to the developed type of irradiation device. Therefore, it has been demanded to provide irradiation devices with an ingenious technique to enable exclusion of such a non-genuine discharge lamp.

The present invention has been produced in view of the drawback described above. It is an object of the present invention to provide the following: a light source device and an irradiation device that can achieve good starting performance even without encapsulating a starting performance promoting substance into the internal space of a luminous tube in a discharge lamp, and simultaneously, can distinguish whether the discharge lamp is a genuine product or not; and a method of distinguishing whether the discharge lamp is a genuine product or not.

Solution to Problems

According to an aspect of the present invention, a light source device is provided, which includes:
  a discharge lamp provided as a light source;
  an incandescent lamp for detecting whether the discharge lamp is a genuine product or not; and
  a reflector container to which the discharge lamp and the incandescent lamp are attached.

The light source device is characterized in that the discharge lamp is lit when receiving rays of ultraviolet light irradiated from an ultraviolet light source provided outside.

According to another aspect of the present invention, an irradiation device is provided, which includes:
  a discharge lamp provided as a light source; and
  an ultraviolet light source irradiating ultraviolet light to the discharge lamp to detect whether the discharge lamp is a genuine product or not in activation of the discharge lamp.

Preferably, the discharge lamp is one of a plurality of discharge lamps, which are included in the irradiation device, and to which the ultraviolet light source irradiates the ultraviolet light.

Preferably, the ultraviolet light source is attached to a vicinity of the discharge lamp and irradiates the ultraviolet light to the discharge lamp on a one-to-one basis.

Preferably, the ultraviolet light source is an LED.

Preferably, the ultraviolet light source includes an LED and an incandescent lamp connected in series to the LED.

Preferably, the irradiation device further includes:
- a discharge lamp power supply supplying an electric power for lighting to the discharge lamp;
- an ultraviolet light source power supply supplying an electric power for lighting to the ultraviolet light source;
- a discharge lamp switch conducting and blocking the electric power supplied from the discharge lamp power supply;
- an ultraviolet light source switch conducting and blocking the electric power supplied from the ultraviolet light source power supply;
- a controller that has a function of turning on and off each of the discharge lamp switch and the ultraviolet light source switch, performs a first action by turning on the discharge lamp switch while leaving the ultraviolet light source switch turned off, and performs a second action by turning on the ultraviolet light source switch and then turning on the discharge lamp switch while leaving the ultraviolet light source switch turned on; and
- a determiner determining either that the discharge lamp is not a genuine product when the discharge lamp has been lit by turning on the discharge lamp switch in both of the first and second actions or that the discharge lamp is a genuine product when the discharge lamp has been lit by turning on the discharge lamp switch only in the second action.

According to yet another aspect of the present invention, a distinguishing method for a discharge lamp is provided, which includes:
- performing a first action by turning on a discharge lamp switch that conducts and blocks an electric power supplied for lighting a discharge lamp from a discharge lamp power supply while leaving, turned off, an ultraviolet light source switch that conducts and blocks an electric power supplied for lighting an ultraviolet light source from an ultraviolet light source power supply;
- performing a second action by turning on the ultraviolet light source switch and then turning on the discharge lamp switch while leaving the ultraviolet light source switch turned on; and
- determining either that the discharge lamp is not a genuine product when the discharge lamp has been lit by turning on the discharge lamp switch in both of the first and second actions or that the discharge lamp is a genuine product when the discharge lamp has been lit by turning on the discharge lamp switch only in the second action.

Advantageous Effects of Invention

According to the present invention, it was made possible to provide the following: a light source device that can achieve good starting performance even without encapsulating a starting performance promoting substance into the internal space of a luminous tube in a discharge lamp, and simultaneously, can distinguish whether the discharge lamp is a genuine product or not; an irradiation device; and a method of distinguishing whether the discharge lamp is a genuine product or not.

DESCRIPTION OF EMBODIMENTS

Practical Example 1

In practical example 1, explanation will be made regarding an exemplary configuration that an irradiation device 50, to which the present invention is applied, is used for an exposure machine 10 for exposing a printed wiring board or so forth to light. Obviously, the irradiation device 50 is usable not only for the exposure machine 10 but also for other illumination applications. Besides, depending on illumination applications, a suitable wavelength is selected as the wavelength of light irradiated from discharge lamps 110.

(Configuration of Exposure Machine 10)

Figure 1:
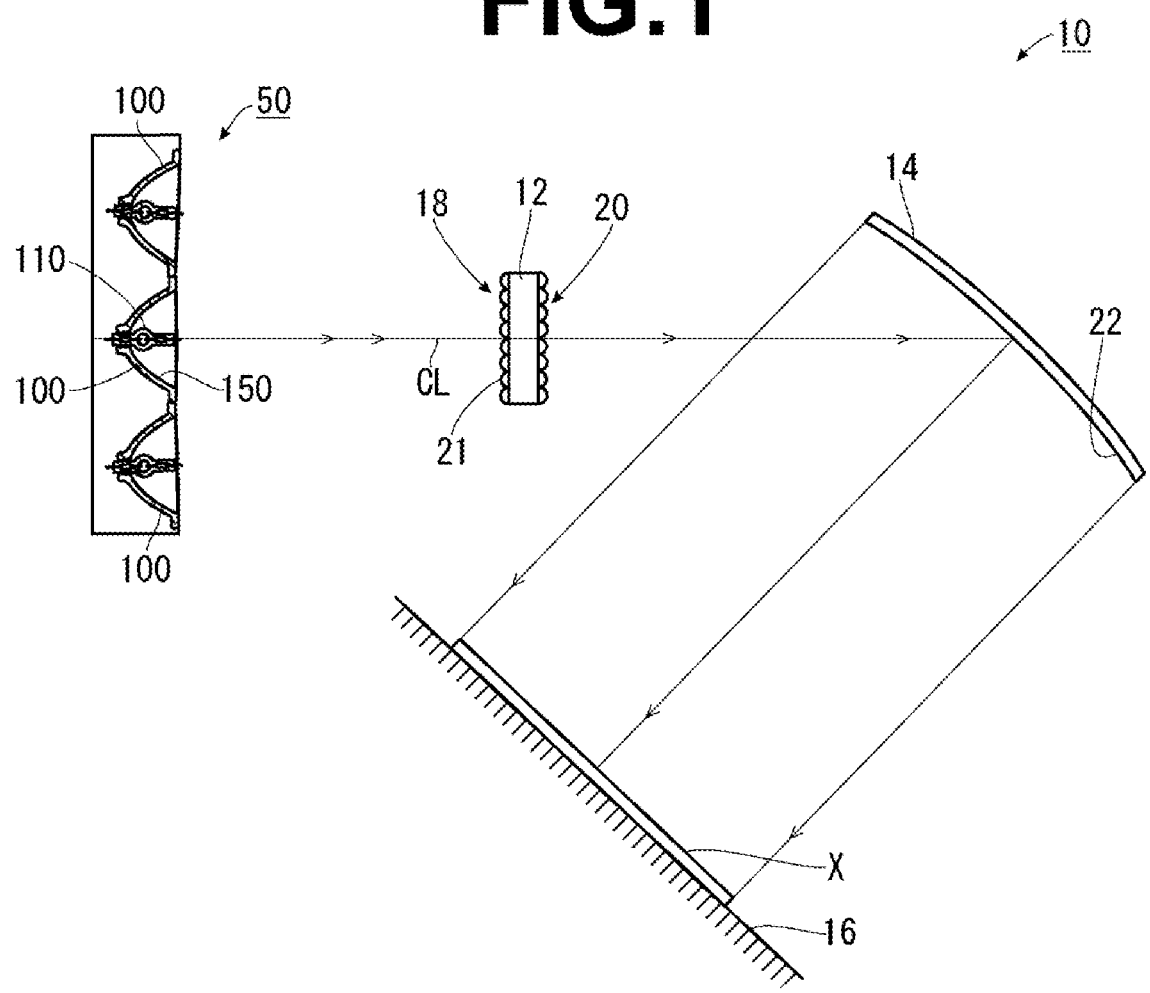
FIG. 1 is a diagram showing an exemplary exposure machine (10) to which the present invention is applied.

FIG. 1 shows the exposure machine 10 according to the practical example 1 to which the present invention is applied. The exposure machine 10 is mainly composed of the irradiation device 50, an integrator 12, a concave mirror 14 and an irradiated surface 16.

The irradiation device 50 irradiates light with a wavelength suitable for exposure of an exposed object X. The irradiation device 50 will be explained in detail after explanation of the configuration of the exposure machine 10.

The integrator 12 includes an incident surface 18 and an emission surface 20. Light irradiated from the irradiation device 50 is received by the incident surface 18. The received light is emitted from the emission surface 20, while being enhanced in homogeneity therethrough. Each of the incident surface 18 and the emission surface 20 is provided with a plurality of fly-eye lenses 21.

The concave mirror 14 includes a reflective concave surface 22 on the inner side thereof. The concave mirror 14 changes the light emitted from the integrator 12 into the form of parallel light by reflecting the light at the reflective concave surface 22.

The irradiated surface 16 is a surface by which the parallel light from the concave mirror 14 is received. The irradiated surface 16 is disposed to face approximately orthogonal to the parallel light. The exposed object X is mounted to the irradiated surface 16. A photosensitive agent, for instance, is applied to the surface of the exposed object X. When a desired region of the exposed object X is irradiated by the parallel light from the concave mirror 14, a desired circuit pattern or so forth is formed on the surface of the exposed object X.

(Configuration of Irradiation Device 50)

Figure 2:
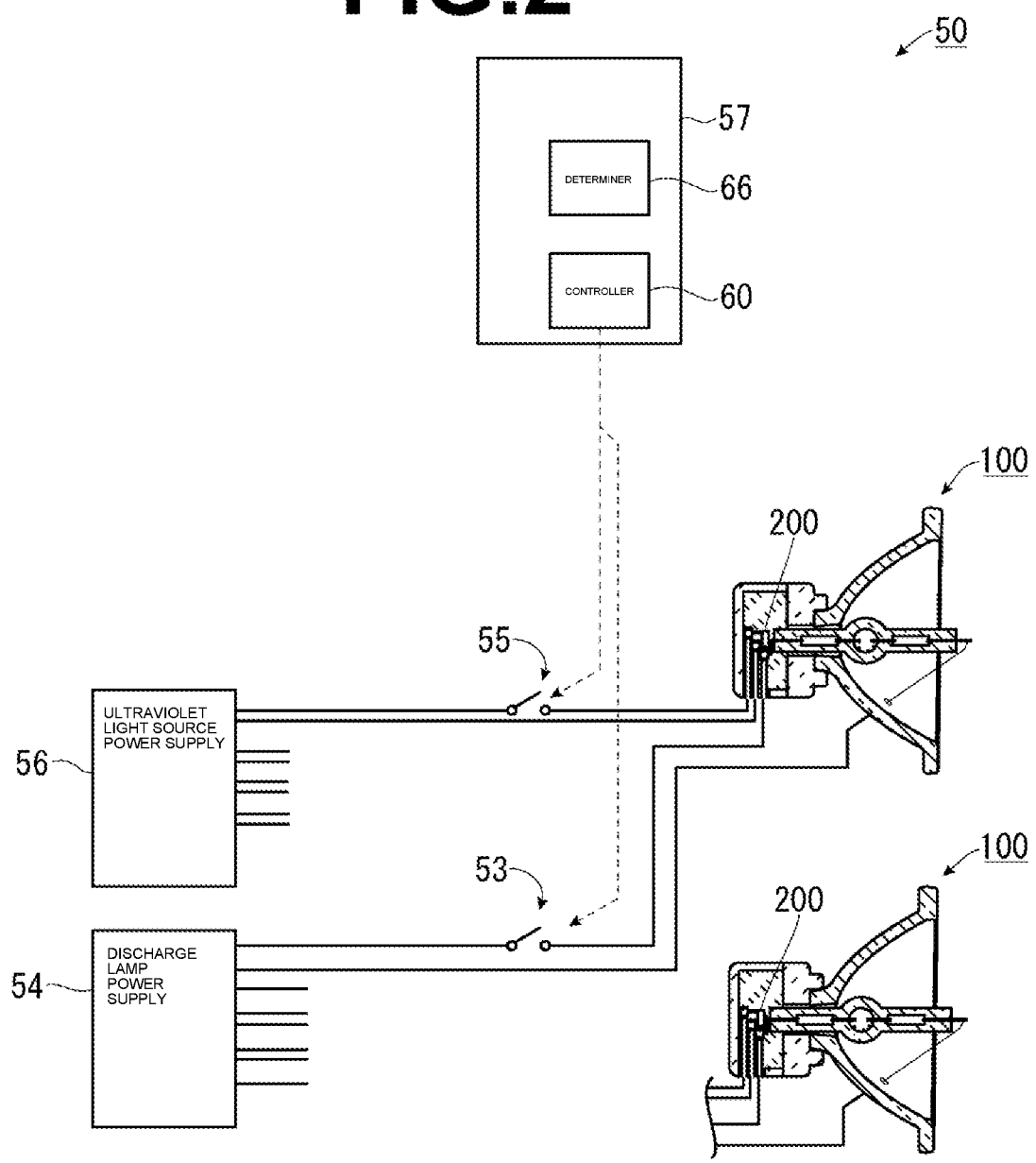
FIG. 2 is a diagram showing an exemplary irradiation device (50) to which the present invention is applied.
Figure 3:
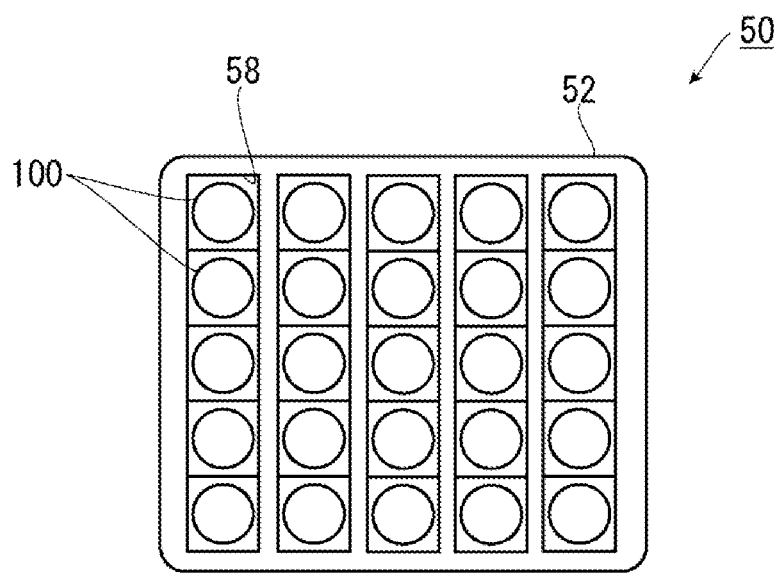
FIG. 3 is a plan view of the exemplary irradiation device (50) to which the present invention is applied.

FIG. 2 is a diagram showing the irradiation device 50 according to the practical example 1 to which the present invention is applied. Besides, FIG. 3 is a plan view of the irradiation device 50. The irradiation device 50 includes a plurality of light source devices 100, a plurality of ultraviolet light sources 200, a frame 52, a plurality of discharge lamp switches 53, a discharge lamp power supply 54, a plurality of ultraviolet light source switches 55, an ultraviolet light source power supply 56 and a distinguishing device 57.

Figure 4:
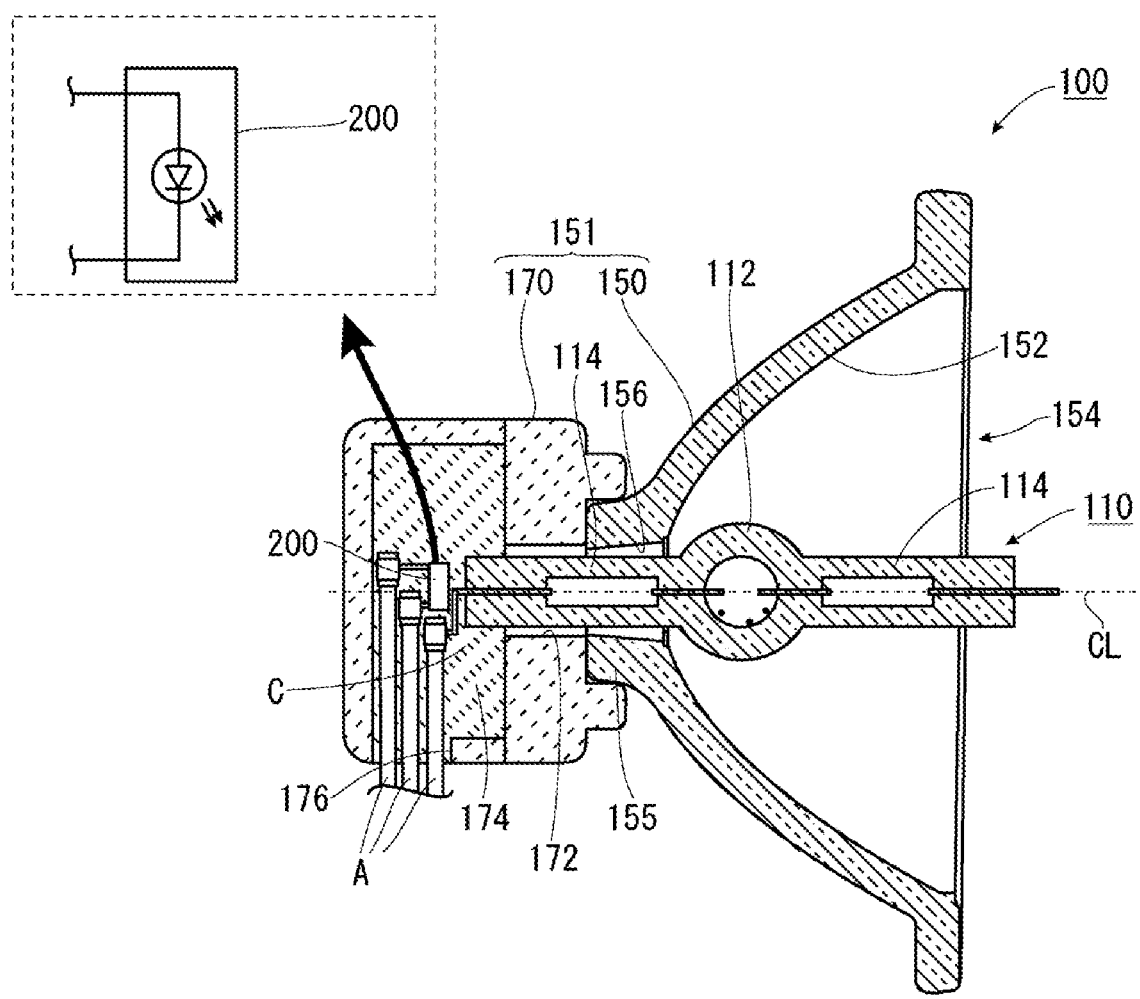
FIG. 4 is a cross-sectional view of an exemplary light source device (100) to which the present invention is applied.

Each light source device 100 irradiates light with a wavelength suitable for exposure of the exposed object X. As shown in FIG. 4, each light source device 100 is mainly composed of a discharge lamp 110, a reflector 150 and an insulating base 170. It should be noted that the reflector 150 and the insulating base 170 will be collectively referred to as a reflector container 151 on an as-needed basis.

In the present practical example, the ultraviolet light sources 200 are LEDs, each of which irradiates ultraviolet light and is embedded into each light source device 100. Hence, in the present practical example, explanation of each ultraviolet light source 200 will be made together with that of each light source device 100. It should be noted that the ultraviolet light sources 200 are not limited to the LEDs; any type of lights such as high pressure mercury lamps or metal halide lamps may be used as the ultraviolet light sources 200 as long as those are capable of irradiating ultraviolet light. Especially in irradiating ultraviolet light to a plurality of discharge lamps 110 as shown in modification 1 (to be described), it is preferred to select a type of lamps each having a large emission amount.

Figure 5:
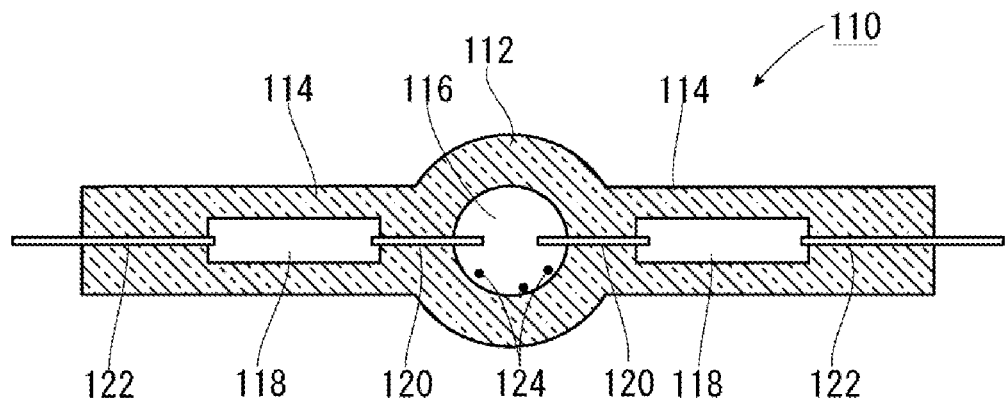
FIG. 5 is a cross-sectional view of an exemplary discharge lamp (110).

As shown in FIG. 5, the discharge lamp 110 includes a luminous tube portion 112 and a pair of sealed portions 114 extending from the luminous tube portion 112. The luminous tube portion 112 and the pair of sealed portions 114 are integrally made of silica glass. Moreover, an internal space 116 is formed in the luminous tube portion 112 and is sealed by the pair of sealed portions 114.

The discharge lamp 110 includes a pair of foils 118, a pair of electrodes 120 and a pair of lead rods 122 in the pair of sealed portions 114, respectively. The pair of foils 118 is made of molybdenum and is embedded in the pair of sealed portions 114, respectively. The pair of electrodes 120 is made of tungsten. One end of each electrode 120 is connected to one end of each foil 118, whereas the other end thereof is disposed inside the internal space 116. One end of each lead rod 122 is connected to the other end of each foil 118, whereas the other end thereof extends to the outside from each sealed portion 114. Besides, a predetermined amount of mercury 124 and a predetermined amount of halogen (e.g., bromine) are encapsulated in the internal space 116.

When a high voltage of predetermined magnitude is applied to the pair of lead rods 122 mounted to the discharge lamp 110, a glow discharge starts between the pair of electrodes 120 mounted to the internal space 116 of the luminous tube portion 112. Afterwards, the glow discharge transitions to an arc discharge. The mercury 124 is evaporated and excited by the arc and emits light (mainly ultraviolet light).

Referring back to FIG. 4, in each light source device 100 according to the present practical example, one of the pair of sealed portions 114 is inserted and mounted into a sealed portion inserted-and-mounted hole 156 of the reflector 150. It should be noted that the discharge lamp 110 may be used for alternating current lighting, or alternatively, may be used for direct current lighting.

The reflector 150 includes a reflective surface 152 made in the shape of a bowl on the inner surface thereof. The reflective surface 152 reflects part of light irradiated from the discharge lamp 110 disposed such that the luminous tube portion 112 is located inside the reflector 150. In the present practical example, the reflective surface 152 is defined by a paraboloid of revolution. Besides, an emission point in the discharge lamp 110 (roughly a middle position of the arc formed between the pair of electrodes 120 in the internal space 116) is matched with the focal point of the paraboloid of revolution. Accordingly, the light emitted from the emission point of the discharge lamp 110 is reflected by the reflective surface 152 and is then outputted from an opening 154 of the reflector 150 in the form of approximately parallel light. It is obvious that the reflective surface 152 is not limited to be made in the shape described above, and may be made in the shape of any other ellipsoid of revolution, any other surface of revolution, or any other surface excluding the surface of revolution. In addition, the emission point is not necessarily required to be matched with the focal point and may be displaced from the focal point on an as-needed basis.

Moreover, the reflector 150 includes a bottom neck 155 protruding from the opposite side of the opening 154. Furthermore, the reflector 150 is provided with the sealed portion inserted-and-mounted hole 156 in the reflective surface 152 such that one of the pair of sealed portions 114 in the discharge lamp 110 is inserted and mounted thereinto. The sealed portion inserted-and-mounted hole 156 is bored from the bottom of the reflective surface 152 to the distal end of the bottom neck 155.

As shown in FIG. 1, by combining the reflector 150 to the discharge lamp 110, rays of light irradiated from the discharge lamp 110 are configured to travel ahead of the reflector 150 within a range spreading about a ray of light traveling along a center axis CL of the reflective surface 152 at a predetermined angle (angle of aperture).

Referring back to FIG. 4, the insulating base 170 is made of electric insulator such as ceramic and is provided with a reflector insertion hole 172 such that one of the pair of sealed portions 114 in the discharge lamp 110, which is inserted and mounted into the sealed portion inserted-and-mounted hole 156, and the bottom neck 155 of the reflector 150 are inserted thereinto. With the structure that the bottom neck 155 and one of the pair of sealed portions 114 are inserted into the reflector insertion hole 172, the insulating base 170 is configured to cover the sealed portion inserted-and-mounted hole 156 from outside.

Besides, the insulating base 170 is provided with an inner space 174 that communicates with the reflector insertion hole 172 described above. Moreover, the insulating base 170 is provided with a power supply cable inserted-through hole 176 that the inner space 174 and the outside communicate with each other therethrough and that power supply cables A are inserted therethrough.

Furthermore, the insulating base 170 and the discharge lamp 110 are fixed to each other by an inorganic adhesive C having electric insulating properties and high thermal conductivity. This will be specifically explained as follows: the end of the bottom neck 155 of the reflector 150 and one of the pair of sealed portions 114 in the discharge lamp 110 are inserted into the reflector insertion hole 172 of the insulating base 170; moreover, while the ultraviolet light source 200 and the power supply cables A are disposed in the inner space 174 of the insulating base 170, the inner space 174 is filled up with the inorganic adhesive C. It should be noted that the ultraviolet light source 200 is attached to the vicinity of the discharge lamp 110; what is more, the ultraviolet light source 200 is preferably set in place to irradiate ultraviolet light toward the end surface of one of the pair of the sealed portions 114 (i.e., the one inserted into the reflector insertion hole 172) in the discharge lamp 110.

Referring back to FIG. 3, the frame 52 is a member made in the shape of an approximately cuboid provided with a plurality of recesses 58 to which the plurality of light source devices 100 are attached.

Referring back to FIG. 2, the discharge lamp power supply 54 supplies required electric power (of direct current or alternating current) to the discharge lamp 110 in each of the light source devices 100 attached to the frame 52. On the other hand, the ultraviolet light source power supply 56 is a power supply for supplying direct current to the ultraviolet light source 200 embedded in each of the light source devices 100. The ultraviolet light source switch 55 conducts and blocks constant direct current supplied to the ultraviolet light source 200. The direct current, supplied from the ultraviolet light source power supply 56, is configured to flow in a forward direction of the LED provided as the ultraviolet light source 200.

Figure 6:
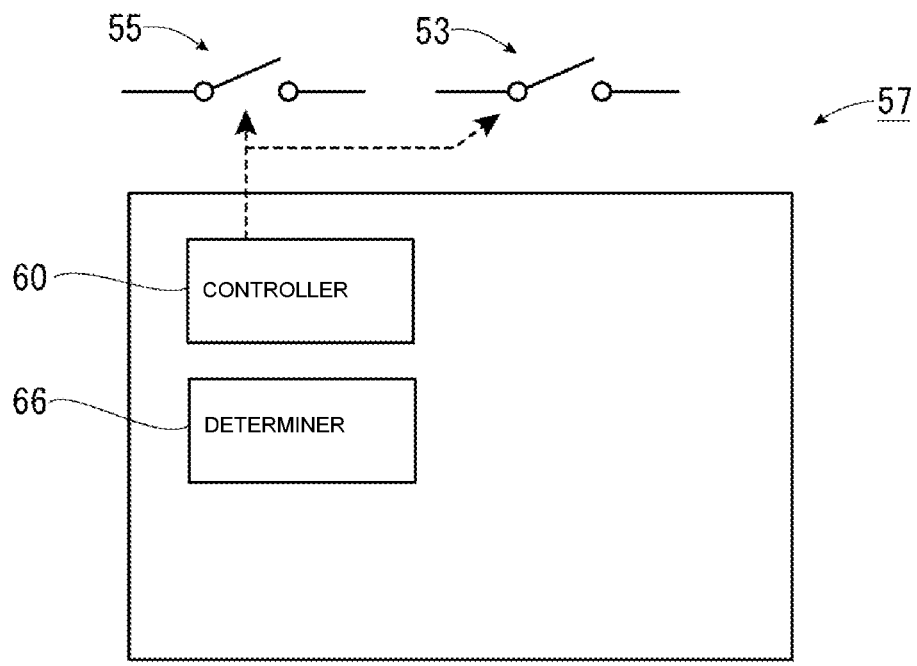
FIG. 6 is a diagram showing an exemplary distinguishing device (57) to which the present invention is applied.

The distinguishing device 57 is a device for distinguishing whether each light source device 100 (each discharge lamp 110) is a genuine product or not. As shown in FIG. 6, the distinguishing device 57 mainly includes a controller 60 and a determiner 66.

The controller 60 has the following functions feasible by operating each discharge lamp switch 53 and each ultraviolet light source switch 55: conducting and blocking electric current supplied to each discharge lamp 110 from the discharge lamp power supply 54; and conducting and blocking electric current supplied to each ultraviolet light source 200 from the ultraviolet light source power supply 56.

The controller 60 basically performs two actions. Specifically, the controller 60 performs the first action by turning on each discharge lamp switch 53 while leaving each ultraviolet light source switch 55 turned off. The controller 60 performs the second action by turning on each ultraviolet light source switch 55 and then turning on each discharge lamp switch 53 while leaving the ultraviolet light source switch 55 turned on.

If a given discharge lamp 110 has been lit by turning on its relevant discharge lamp switch 53 in both of the first and second actions performed by the controller 60, the determiner 66 determines that the given discharge lamp 110 is not a genuine product. By contrast, if the given target discharge lamp 110 has been lit by turning on the relevant discharge lamp switch 53 only in the second action (i.e., by turning on and leaving its relevant ultraviolet light source switch 55 turned on), the determiner 66 determines that the given discharge lamp 110 is a genuine product.

It should be noted that in determining whether the given discharge lamp 110 has been lit or not, the determiner 66 may determine: "the given discharge lamp 110 has been lit", for instance, when a voltage supplied to the given discharge lamp 110 from the discharge lamp power supply 54 has changed from a high level (before lighting [dielectric breakdown]) to a lower level (after lighting [dielectric breakdown]). Alternatively, by setting a photosensor in place to receive light from the given discharge lamp 110, the determiner 66 is also enabled to determine: "the given discharge lamp 110 has been lit" when the photosensor has received the light from the given discharge lamp 110. Obviously, the determiner 66 may determine: "the given discharge lamp 110 has been lit" with a method other than the above.

(Action for Distinguishing Genuine Product in Irradiation Device 50)

When a power supply switch (not shown in the drawings) of the irradiation device 50 is turned on, the controller 60 in the distinguishing device 57 starts performing the actions. In attempt to light the discharge lamp 110 in given one of the light source devices 100 attached to the frame 52, the controller 60 turns on the discharge lamp switch 53 that supplies electric power to the discharge lamp 110 in the given light source device 100, while leaving, turned off, the ultraviolet light source switch 55 that supplies electric power to the ultraviolet light source 200 in the given light source device 100 (first action). Afterwards, the controller 60 temporarily turns off the discharge lamp switch 53. Then, the controller 60 turns on the ultraviolet light source switch 55, and in addition, turns on the discharge lamp switch 53 again (second action). It should be noted that the timing of actions performed by the distinguishing device 57 is not limited to the above.

The determiner 66 determines whether the discharge lamp 110 has been lit or not in each of the first and second actions, and as described above, distinguishes whether the discharge lamp 110 is a genuine product or not based on the determination results.

After completing the genuine product distinguishing procedure for the first one of the light source devices 100, the controller 60 starts supplying current to the discharge lamp 110 in another one of the light source devices 100. Subsequently, the genuine product distinguishing procedure is similarly performed for another one of the light source devices 100 as done for the first one described above and is repeated in the same manner until inspection is completed for all or a predetermined range of the light source devices 100.

(Features of Irradiation Device 50)

According to the present practical example, it was made possible to improve the starting performance of each discharge lamp 110 by irradiating ultraviolet light to the discharge lamp 110 from its relevant ultraviolet light source 200 even without encapsulating a starting performance promoting substance (e.g., krypton-85) into the internal space 116 of the luminous tube portion 112 in the discharge lamp 110.

Besides, it was made possible to distinguish whether each discharge lamp 110 is a genuine product or not by the distinguishing device 57. Accordingly, such a situation can be avoided that a non-genuine discharge lamp 110 having a risk of bursting due to long-time use continues to be used erroneously.

Modification 1

Figure 7:
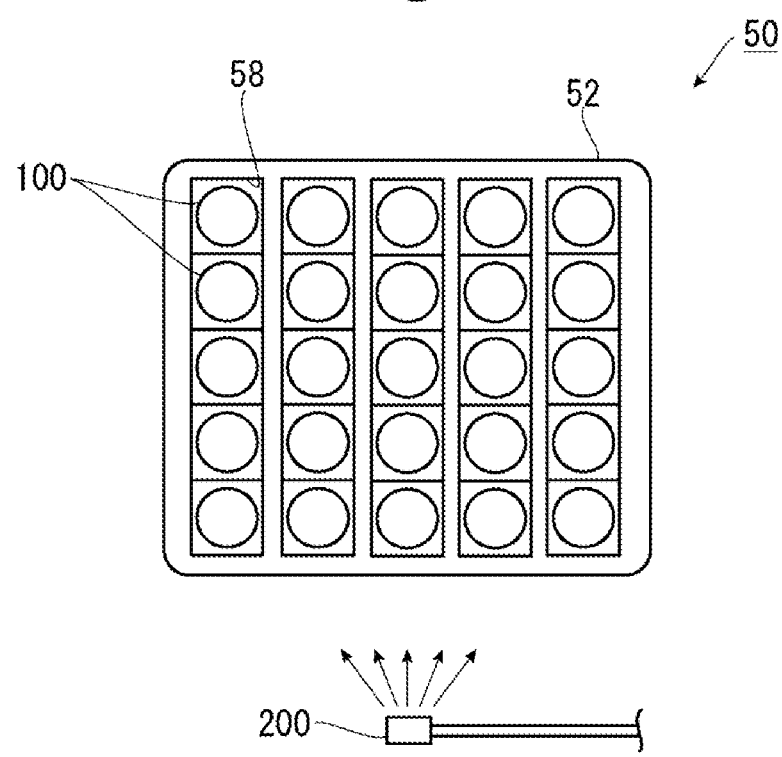
FIG. 7 is a diagram showing another exemplary irradiation device (50) according to modification 1.

In the practical example 1 described above, the plural ultraviolet light sources (LEDs) 200 are attached to the plural discharge lamps 110 on a one-to-one basis. Alternatively, as shown in FIG. 7, a single ultraviolet light source 200 may be disposed to be capable of irradiating ultraviolet light toward the discharge lamps 110 in the plural light source devices 100 attached to the frame 52. In this case, the ultraviolet light source 200 is configured to directly irradiate the ultraviolet light onto the luminous tube portion 112 of the discharge lamp 110 through the opening 154 of the reflector 150 in each light source device 100. Then, the starting performance of each discharge lamp 110 can be thereby improved. It should be noted that a plurality of ultraviolet light sources 200 may be herein disposed.

Besides, even in this modification 1, a method of distinguishing whether given one of the discharge lamps 110 is a genuine product or not is the same as that in the practical example 1. In the first action, it is checked whether the given discharge lamp 100 as a target for the distinguishing procedure has been lit or not by turning on its relevant discharge lamp switch 53 that conducts electric power to the given discharge lamp 110, while leaving, turned off, the ultraviolet light source switch 55 that conducts electric power to the ultraviolet light source 200. Then, in the second action, it is checked whether the given discharge lamp 110 has been lit or not by turning on the ultraviolet light source switch 55 and then turning on the relevant discharge lamp switch 53 while leaving the ultraviolet light source switch 55 turned on.

Afterwards, if the given discharge lamp 110 has been lit by turning on the relevant discharge lamp switch 53 in both of the first and second actions, it is determined that the target discharge lamp 110 is not a genuine product. By contrast, if the given discharge lamp 110 has been lit by turning on the relevant discharge lamp switch 53 only in the second action (i.e., by turning on and leaving the ultraviolet light source switch 55 turned on), it is determined that the target discharge lamp 110 is a genuine product.

Modification 2

Figure 8:
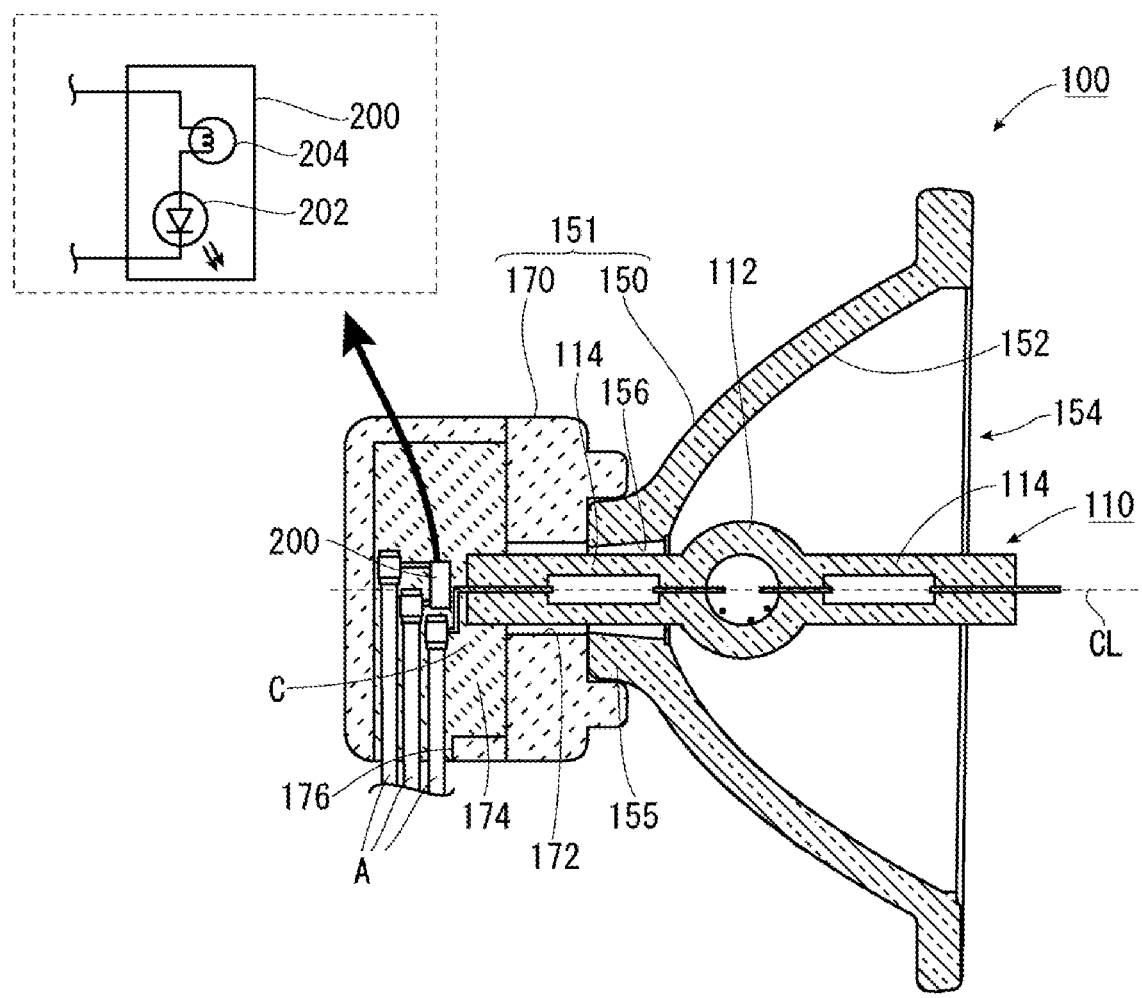
FIG. 8 is a cross-sectional view of another exemplary light source device (100) according to modification 2.

In the practical example described above, the ultraviolet light source 200 in each light source device 100 is composed of the LED only. Alternatively, as shown in FIG. 8, the ultraviolet light source 200 may be composed of an LED 202 and an incandescent lamp 204 connected in series to the LED 202, and may be set in each light source device 100 (more precisely, the inner space 174 of the insulating base 170 in the same manner as the practical example 1). It should be noted that a fuse may be attached in series to each or either of the LED 202 and the incandescent lamp 204 for the purpose of circuit protection and so forth.

In this case, the genuine product distinguishing procedure for given one of the light source devices 100 can be performed by combination of the following methods: the method explained first as a method using the ultraviolet light source 200 in the same manner as the practical example 1; and a method using the incandescent lamp 204. The both methods may be performed simultaneously, or alternatively, either of the methods can be performed as well.

In this modification 2, the genuine product distinguishing procedure using the incandescent lamp 204 is performed by measuring voltage on the both ends of the ultraviolet light source 200 twice at an interval of predetermined time (e.g., 10 seconds) while the controller 60 causes the ultraviolet light source power supply 56 to continuously supply constant current to the incandescent lamp 204.

After starting supplying constant current to the ultraviolet light source 200, a measurer (not shown in the drawings; the same shall apply hereinafter) in the distinguishing device 57 measures voltage on the both ends of the ultraviolet light source 200 (first measurement). Next, after elapse of the predetermined time (e.g., 10 seconds), the measurer again measures voltage on the both ends of the ultraviolet light source 200 (second measurement). The values of voltage measured twice on the both ends are transmitted to the determiner 66 in the distinguishing device 57. It should be noted that the constant current conducted to the ultraviolet light source 200 is direct current corresponding to the current flowing in the forward direction of the LED 202.

When receiving the values of voltage measured twice on the both ends, the determiner 66 checks whether difference between the values of voltage measured twice on the both ends falls within a predetermined value range of voltage or not. When the difference between the values of voltage measured on the both ends falls within the predetermined value range of voltage, the determiner 66 determines that the discharge lamp 110 as a target for inspection is a genuine product. Contrarily, when the difference between the values of voltage measured on the both ends does not fall within the predetermined value range of voltage, the determiner 66 determines that the discharge lamp 110 as the target for inspection is not a genuine product.

In general, because of the character of a filament, the incandescent lamp 204 tends to increase resistance for a while (10 seconds or so) after electric current is conducted thereto. Because of this, the value of voltage measured on the both ends of the ultraviolet light source 200 becomes greater in the second measurement (e.g., 8.5 V) than in the first measurement (e.g., 2.0 V). Accordingly, when the difference between the values of voltage measured twice as described above on the both ends falls within the predetermined value range of voltage (e.g., 6-7 V), the discharge lamp 110 can be determined as a genuine product provided with the incandescent lamp 204.

By contrast, when the discharge lamp 110 is not a genuine product, the difference between the values of voltage measured on the both ends of the ultraviolet light source 200 in the first and second measurements is approximately zero because the ultraviolet light source 200 is not provided with the incandescent lamp 204. Therefore, when the difference between the values of voltage measured on the both ends does not fall within the predetermined value range of voltage, the determiner 66 determines that the discharge lamp 110 as the target for inspection is not a genuine product.

Modification 3

Figure 9:
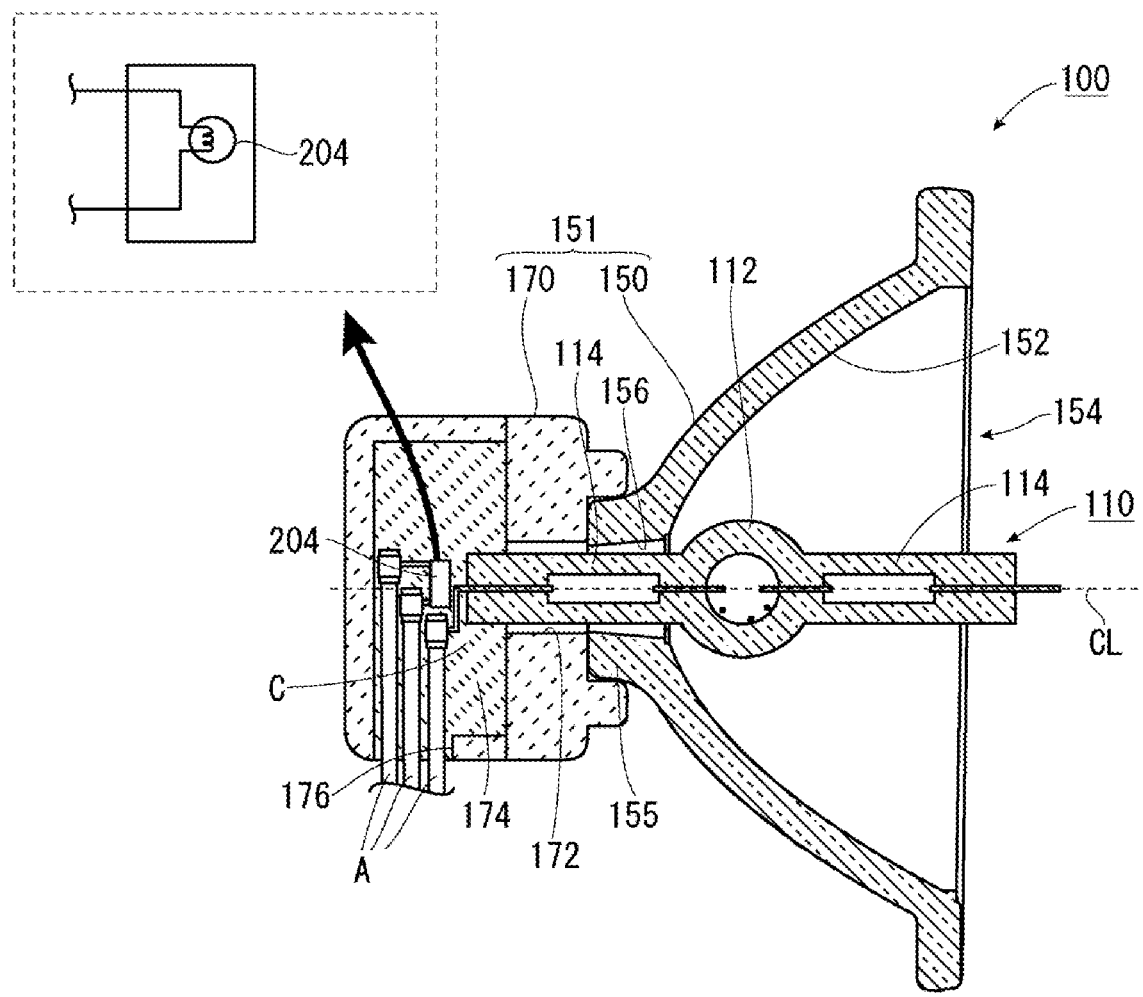
FIG. 9 is a cross-sectional view of yet another exemplary light source device (100) according to modification 3.

As with the modification 1 described above, when the ultraviolet light source 200 is disposed to irradiate ultraviolet light toward the discharge lamp 110 in each of the plural light source devices 100 attached to the frame 52, each light source device 100 may be provided with only the incandescent lamp 204 not the LED 202 as shown in FIG. 9. It should be noted that the incandescent lamp 204 may be disposed anywhere within the insulating base 170, or alternatively, may be attached to the reflector container 151 while being disposed on the outer surface of the insulating base 170, that of the reflector 150 or so forth. Besides, a fuse may be attached in series to the incandescent lamp 204 for the purpose of circuit protection and so forth.

In this case, the genuine product distinguishing procedure for given one of the light source devices 100 can be performed by combination of the following methods: the method using the ultraviolet light source 200 in the same manner as the modification 1; and a method using the incandescent lamp 204. The both methods may be performed simultaneously or sequentially, or alternatively, either of the methods can be performed as well.

The genuine product distinguishing procedure using the incandescent lamp 204 will be hereinafter explained. The genuine product distinguishing procedure using the incandescent lamp 204 is performed by measuring voltage on the both ends of the incandescent lamp 204 connected to a pair of electric supply cables A twice at an interval of predetermined time (e.g., 10 seconds) while the controller 60 causes the ultraviolet light source power supply 56 or another power supply (not shown in the drawings) to continuously supply constant current (regardless of alternating current or direct current) to the incandescent lamp 204.

After starting supplying constant current to the incandescent lamp 204, a measurer (not shown in the drawings; the same shall apply hereinafter) in the distinguishing device 57 measures voltage on the both ends of the incandescent lamp 204 (first measurement). Next, after elapse of the predetermined time (e.g., 10 seconds), the measurer again measures voltage on the both ends of the incandescent lamp 204 (second measurement). The values of voltage measured twice on the both ends are transmitted to the determiner 66 in the distinguishing device 57.

When receiving the values of voltage measured twice on the both ends, the determiner 66 checks whether difference between the values of voltage measured twice on the both ends falls within a predetermined value range of voltage or not. When the difference between the values of voltage measured on the both ends falls within the predetermined value range of voltage, the determiner 66 determines that the discharge lamp 110 as a target for inspection is a genuine product. Contrarily, when the difference between the values of voltage measured on the both ends does not fall within the predetermined value range of voltage, the determiner 66 determines that the discharge lamp 110 as the target for inspection is not a genuine product.

When the discharge lamp 110 is a genuine product provided with the incandescent lamp 204, the value of voltage measured on the both ends of the incandescent lamp 204 becomes greater in the second measurement than in the first measurement. The reason for this is the same as that explained in the modification 2, and therefore, will be omitted by incorporating that by reference into here. Accordingly, when the difference between the values of voltage measured twice as described above on the both ends falls within the predetermined value range of voltage (e.g., 6-7 V), the discharge lamp 110 can be determined as a genuine product provided with the incandescent lamp 204.

By contrast, when the discharge lamp 110 is not a genuine product, the difference between the values of voltage measured on the both ends connected to a pair of power supply cables A in the first and second measurements is approximately zero because the discharge lamp 110 is not provided with the incandescent lamp 204. Therefore, when the difference between the values of voltage measured on the both ends does not fall within the predetermined value range of voltage, the determiner 66 determines that the discharge lamp 110 as the target for inspection is not a genuine product.

It should be understood that the embodiment herein disclosed is illustrative only and is not restrictive in all aspects. It is intended that the scope of the present invention is indicated by the appended claims rather than the explanation described above, and encompasses all the changes that come within the meaning and the range of equivalents of the appended claims.

REFERENCE NUMBER LIST

10 . . . Exposure machine, 12 . . . Integrator, 14 . . . Concave mirror, 16 . . . Irradiated surface, 18 . . . Incident surface, 20 . . . Emission surface, 21 . . . Fly-eye lens, 22 . . . Reflective concave surface
50 . . . Irradiation device, 52 . . . Frame, 53 . . . Discharge lamp switch, 54 . . . Discharge lamp power supply, 55 . . . Ultraviolet light source switch, 56 . . . Ultraviolet light source power supply, 57 . . . Distinguishing device, 58 . . . Recess, 60 . . . Controller, 66 . . . Determiner
100 . . . Light source device
110 . . . Discharge lamp, 112 . . . Luminous tube portion, 114 . . . Sealed portion, 116 . . . Internal space, 118 . . . Foil, 120 . . . Electrode, 122 . . . Lead rod, 124 . . . Mercury
150 . . . Reflector, 151 . . . Reflector container, 152 . . . Reflective surface, 154 . . . Opening,
155 . . . Bottom neck, 156 . . . Sealed portion inserted-and-mounted hole
170 . . . Insulating base, 172 . . . Reflector insertion hole, 174 . . . Inner space, 176 . . . Power supply cable inserted-through hole
200 . . . Ultraviolet light source, 202 . . . LED, 204 . . . Incandescent lamp

What is claimed is:

1. A light source device, comprising:
a discharge lamp provided as a light source;
an incandescent lamp; and
a reflector container to which the discharge lamp and the incandescent lamp are attached;
a controller having a function of continuously supplying a constant current to the incandescent lamp and measuring first and second values of voltage on both ends of the incandescent lamp connected to a pair of electric supply cables; and
a determiner determining either that the discharge lamp is not the genuine product when a difference between the first and second values of voltage measured on the both ends does not fall within a predetermined value range or that the discharge lamp is the genuine product when the difference between the first and second values of voltage measured on the both ends falls within the predetermined value range, wherein
the discharge lamp is lit when receiving rays of ultraviolet light irradiated from an ultraviolet light source provided outside.

2. An irradiation device, comprising:
a discharge lamp provided as a light source;
an ultraviolet light source irradiating ultraviolet light to the discharge lamp to detect whether the discharge lamp is a genuine product or not in activation of the discharge lamp;
a discharge lamp power supply supplying an electric power for lighting to the discharge lamp;
an ultraviolet light source power supply supplying an electric power for lighting to the ultraviolet light source;
a discharge lamp switch conducting and blocking the electric power supplied from the discharge lamp power supply;
an ultraviolet light source switch conducting and blocking the electric power supplied from the ultraviolet light source power supply;
a controller having a function of turning on and off each of the discharge lamp switch and the ultraviolet light source switch, the controller performing a first action by turning on the discharge lamp switch while leaving the ultraviolet light source switch turned off, the controller performing a second action by turning on the ultraviolet light source switch and then turning on the discharge lamp switch while leaving the ultraviolet light source switch turned on; and a determiner determining either that the discharge lamp is not a genuine product when the discharge lamp has been lit by turning on the discharge lamp switch in both of the first and second actions or that the discharge lamp is a genuine product when the discharge lamp has been lit by turning on the discharge lamp switch only in the second action.

3. The irradiation device according to claim 2, wherein the discharge lamp is one of a plurality of discharge lamps to which the ultraviolet light source irradiates the ultraviolet light.

4. The irradiation device according to claim 2, wherein the ultraviolet light source is attached to a vicinity of the discharge lamp, the ultraviolet light source irradiating the ultraviolet light to the discharge lamp on a one-to-one basis.

5. The irradiation device according to claim 2, wherein the ultraviolet light source is an LED.

6. The irradiation device according to claim 2, wherein the ultraviolet light source includes an LED and an incandescent lamp connected in series to the LED.

7. A distinguishing method for a discharge lamp, comprising:

performing a first action by turning on a discharge lamp switch while leaving an ultraviolet light source switch turned off, the discharge lamp switch conducting and blocking an electric power supplied for lighting a discharge lamp from a discharge lamp power supply, the ultraviolet light source switch conducting and blocking an electric power supplied for lighting an ultraviolet light source from an ultraviolet light source power supply;

performing a second action by turning on the ultraviolet light source switch and then turning on the discharge lamp switch while leaving the ultraviolet light source switch turned on; and determining either that the discharge lamp is not a genuine product when the discharge lamp has been lit by turning on the discharge lamp switch in both of the first and second actions or that the discharge lamp is a genuine product when the discharge lamp has been lit by turning on the discharge lamp switch only in the second action.

* * * * *